United States Patent [19]
Gillery et al.

[11] Patent Number: 4,462,884
[45] Date of Patent: Jul. 31, 1984

[54] LOW REFLECTANCE, LOW EMISSIVITY SPUTTERED FILM

[75] Inventors: F. Howard Gillery, Allison Park; Russell C. Criss, Pittsburgh, both of Pa.

[73] Assignee: PPG Industries, Inc., Pittsburgh, Pa.

[21] Appl. No.: 516,816

[22] Filed: Jul. 25, 1983

[51] Int. Cl.³ ............................................. C23C 15/00
[52] U.S. Cl. ............................ 204/192 C; 204/192 SP; 204/192 R; 428/630
[58] Field of Search .......... 204/192 C, 192 SP, 192 R

[56] References Cited

U.S. PATENT DOCUMENTS

| | | | |
|---|---|---|---|
| 3,457,138 | 7/1969 | Miller | 161/196 |
| 3,904,503 | 9/1975 | Hanfmann | 204/192 R |
| 3,904,506 | 9/1975 | Carmichael et al. | 204/192 R |
| 3,925,182 | 12/1975 | Carmichael et al. | 204/192 R |
| 4,009,090 | 2/1977 | Veigel | 204/192 R |
| 4,166,018 | 8/1979 | Chapin | 204/298 |

Primary Examiner—Arthur P. Demers
Attorney, Agent, or Firm—Donna L. Seidel

[57] ABSTRACT

A method is disclosed for producing by cathode sputtering a silver/copper coated article which duplicates the low reflectance colored appearance of a silver/copper coated article produced by wet chemical deposition. The method involves depositing the silver layer in a discontinuous agglomerated state.

8 Claims, 2 Drawing Figures

LOW REFLECTANCE, LOW EMISSIVITY SPUTTERED FILM

BACKGROUND OF THE INVENTION

The present invention relates generally to the art of transparent metallic films for solar energy control, and more particularly to the art of sputtering silver-containing films.

Transparent metallic films for solar energy control may be prepared by wet chemical deposition processes which involve solutions of metallic ions which are chemically reduced by reducing agents to form metallic films. Transparent films of metals such as silver, copper, nickel and cobalt are readily produced by such methods. U.S. Pat. No. 3,457,138 to Miller discloses an electroless (wet chemical) method for producing transparent copper films over a thin transparent silver film on glass. Similarly produced wet chemical silver/copper films on glass have achieved commercial success as solar energy control architectural products. The coating effectively reflects solar heat energy while presenting an aesthetically appealling low reflectance pinkish colored surface to the observer.

Advances in coating technology provide alternative processes such as chemical vapor deposition, vacuum evaporation deposition, and cathode sputtering for producing transparent metallic films for solar energy control. Cathode sputtering is particularly desirable for producing metallic films in a method that is fast and efficient on a large scale. U.S. Pat. No. 4,166,018 to Chapin discloses a particularly useful sputtering process and apparatus which employ a magnetic field to improve cathode sputtering conditions.

In an attempt to reproduce the properties of a wet chemical two-layer silver/copper film on glass by cathode sputtering, it was discovered that, using known cathode sputtering techniques to produce two-layer silver/copper films over a variety of thicknesses and thickness ratios, the desirable low reflectance pinkish colored appearance of the wet chemical two-layer silver/copper film could not be obtained. Rather, typical sputtering conditions result in two-layer silver/copper films that range in appearance from highly reflective bright silver to highly reflective bright copper depending on the silver/copper ratio and the orientation of the sample.

SUMMARY OF THE INVENTION

The present invention provides a method for producing transparent two-layer silver/copper films having a low reflectance pinkish colored appearance by cathode sputtering. The method of the present invention requires the deposition of a first layer of silver in a discontinuous agglomerated state. The deposition of a continuous copper film over the discontinuous agglomerated silver film produces the desired low reflectance pinkish colored appearance characteristic of the wet chemical product. The deposition of silver in a discontinuous agglomerated state by cathode sputtering requires conditions which allow the silver arriving at the substrate surface sufficient time to agglomerate. This can be accomplished by either slowing the arrival rate of silver or increasing its mobility at the substrate surface. Slowing the arrival rate of the sputtered silver may be achieved by either lowering the power applied to the sputtering cathode or by increasing the gas pressure in the vacuum chamber in which the sputtering process is being performed. Increasing the mobility of the silver may be achieved by raising the temperature or decreasing the surface energy of the substrate.

DESCRIPTION OF THE PREFERRED EMBODIMENTS

Since increasing the gas pressure or raising the temperature are limited in practice by other cathode sputtering process requirements, and decreasing the surface interaction may affect adherence of the coating, the preferred practice of the present invention involves controlling the power applied to the sputtering cathode in order to deposit a silver film in a discontinuous agglomerated state. The lower the power density (applied power divided by effective cathode surface area), the slower the silver is deposited and the greater its degree of agglomeration. In order to prevent slower silver deposition from lowering production rates, two or more cathodes may be used provided that the power applied to each is controlled at a sufficiently low level to deposit a discontinuous agglomerated silver film.

With reference to the drawings, all of the curves illustrate that as a silver film is deposited on a transparent substrate, the transmission initially decreases as silver begins to deposit on the surface. This section of each curve, from the initial high transmission to the minimum in the curve, represents a discontinuous agglomerated silver film which is increasing quantitatively and therefore decreasing in transmission. The section from this minimum point to the maximum on each curve represents the transition from a discontinuous agglomerated silver film to a continuous film, the transmission rising as the agglomerated silver spreads out to form a thinner but continuous film. Once a continuous film is formed, represented by a point near the maximum on each curve, the transmission steadily decreases with increasing film thickness until an opaque coating is obtained.

Figure 1:
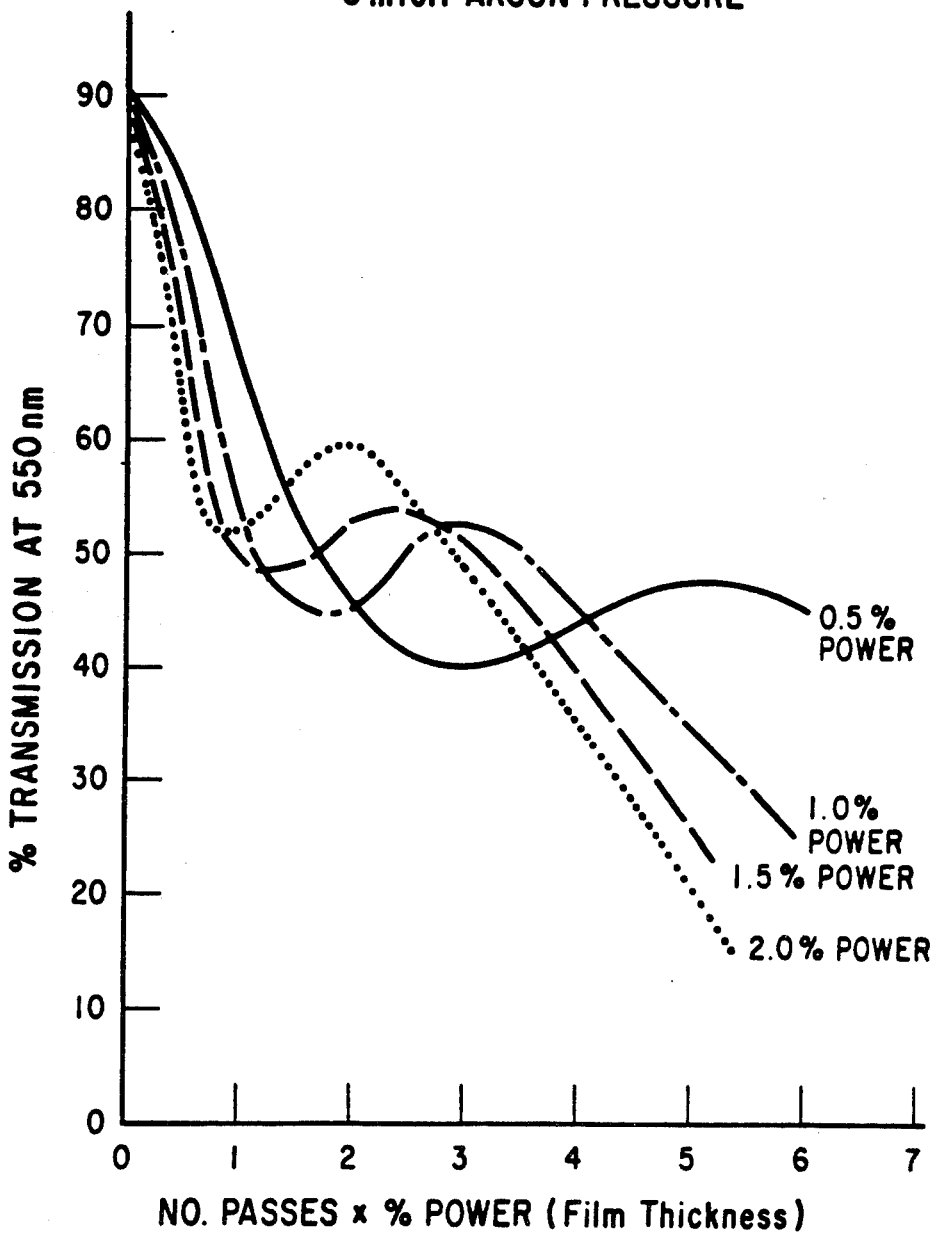
FIG. 1 illustrates the transmission of silver films as a function of film thickness at four different levels of power applied to a silver cathode at a constant gas pressure.

The four curves in FIG. 1 illustrate that as the power applied to the cathode is decreased, the minimum point which represents maximum agglomeration of silver shifts to higher film thicknesses. This range of transmission minima, from about 52 to about 40 percent for the curves in FIG. 1, obtainable by controlling the power applied to the cathode at a low level, makes possible the deposition of a discontinuous agglomerated silver film having the necessary spectral properties to provide, when overcoated with copper, a low reflectance pinkish colored article. Normal cathode sputtering conditions rapidly deposit a continuous silver film with steadily decreasing transmittance.

Figure 2:
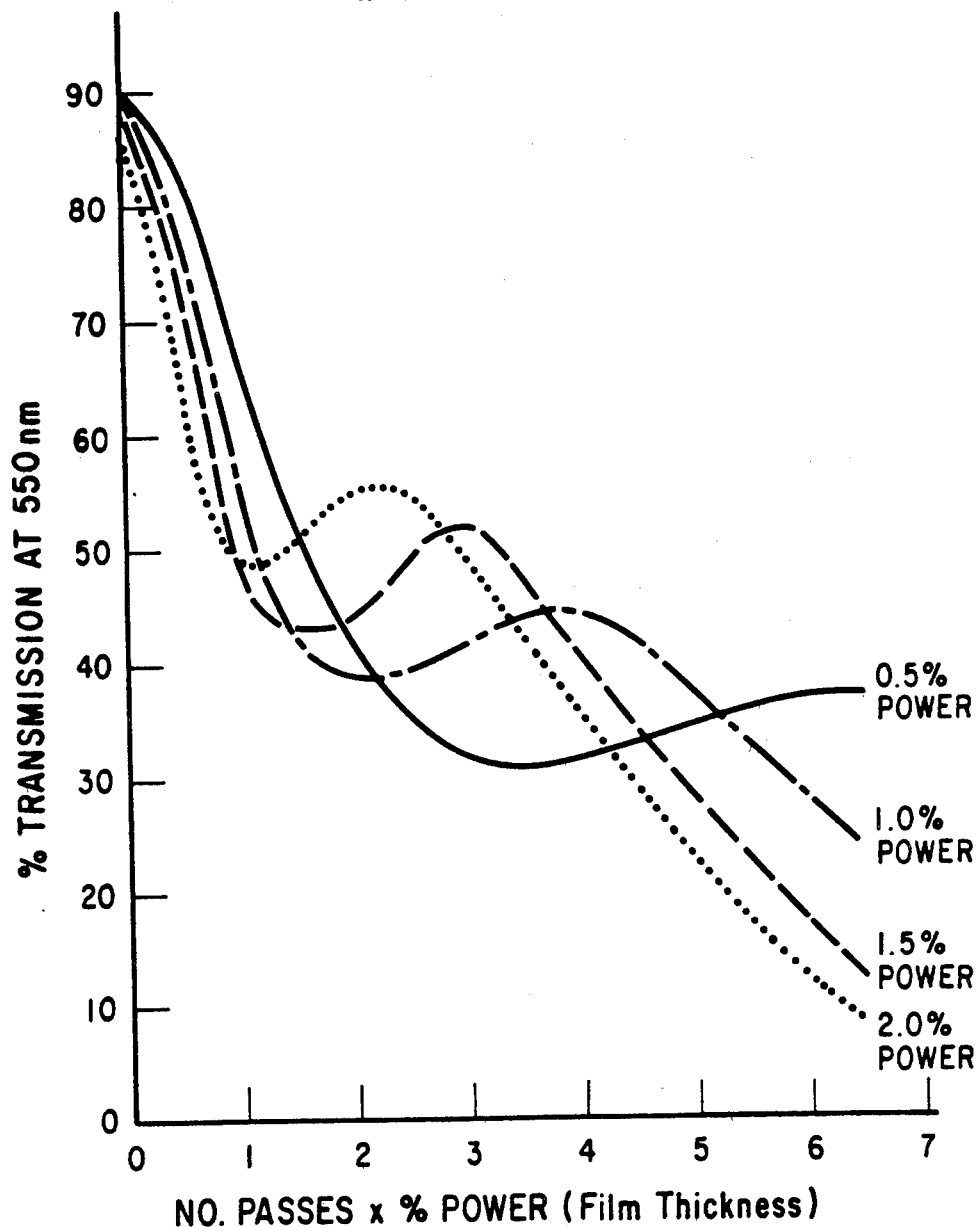
FIG. 2 illustrates the transmission of silver films as a function of film thickness at the same four power levels shown in FIG. 1 but at double the gas pressure.

The curves illustrated in FIG. 2 show that the transmissions at the minima can be further reduced by increasing the gas pressure in the vacuum chamber. The four curves of FIG. 2 represent film deposition at a pressure of 6 millitorr in argon compared with 3 millitorr for the film deposition illustrated in FIG. 1. Transmissions at the minima for each of the power levels common to both figures range from about 48 to about 32 percent for the higher pressure conditions represented in FIG. 2.

The shape of the curves in FIGS. 1 and 2 is characteristic of discontinuous agglomerated films. The initial descent of the curve from the point of highest transmission, that of the uncoated transparent substrate, represents the decreasing transmission of discontinuous silver particles as more silver is deposited. A minimum in the transmission curve is reached at a point of maximum agglomeration. After this point, as more silver is deposited, the agglomerated particles begin to coalesce to form a continuous but thinner film and the transmission gradually increases to a maximum, at which point the film is essentially continuous. From this point on, the transmission steadily decreases with a continuous film increasing in film thickness until an opaque film is obtained.

Under normal sputtering conditions, the transmission steadily decreases with increasing film thickness throughout the deposition process because a discontinuous agglomerated film is not produced at useful film thicknesses. However, the present invention requires a discontinuous agglomerated silver film in order to duplicate the low reflectance and desired color of a wet chemical silver/copper film. Theoretically, this is because the silver film in the discontinuous agglomerated state behaves more like an absorbing dielectric than like a reflecting metal. The minimum in the transmission curve is an indication of the degree of agglomeration; the lower the minimum, the greater the degree of agglomeration. However, for purposes of the present invention, the film with the greatest degree of agglomeration is not necessarily the best layer upon which to deposit a copper film in order to obtain the desired low reflectance, pinkish colored appearance. If the minimum occurs at too small a silver film thickness, the reflective copper color will predominate. Likewise, if the minimum occurs at too great a silver thickness, the silver color will predominate. In order to obtain a particularly desired appearance in a silver/copper coated article, both reflectance and color are critical. Applying the silver in a discontinuous agglomerated state provides the desired low reflectance and adjusting process parameters so that the transmission minimum occurs at an appropriate silver thickness provides the desired color.

In a most preferred embodiment of the present invention, silver films are deposited in a discontinuous agglomerated state at a transmission minimum of about 40 to 55 percent, preferably about 42 to 50 percent, most preferably about 44 to 46 percent (measured on a clear glass substrate with a transmission of about 90 percent). When the transmission minimum is below about 40 percent, the reflectance is suitably low but the color is predominantly silver. When the transmission minimum is above about 55 the reflectance is higher than desired for a low reflectance coated article.

The present invention will be further understood from the descriptions of specific examples which follow.

EXAMPLES

Clear float glass sheets 12 inches (30.5 centimeters) square and 6 millimeters thick are washed in a conventional washer using Dart 210 detergent. The transmission of the clear glass measured at 550 nanometers is about 90 percent. Clean glass sheets are coated with silver and copper using an in-line coater available from Airco-Temescal. The coater is a single ended, load-lock coater capable of coating glass in sizes up to 12 by 15 inches (30.5 by 38.1 centimeters) on a conveyor while employing up to three stationary cathodes which are 5 by 17 inches (12.7 by 42.2 centimeters). Adjacent the planar sputtering surfaces is created a magnetic field comprising curved lines of magnetic flux which form a closed loop erosion region on the sputtering surface. This erosion region has a slightly irregular "oval racetrack" shape which makes the effective surface area of the cathode, and hence the power density, difficult to calculate exactly. For this reason, these examples will refer to power applied to the cathode; the power density may be estimated by assuming the effective cathode surface area to be about 55 to 60 percent of the actual planar cathode surface area.

A silver and a copper cathode are installed in the coater, to be separately activated depending upon which metal is to be deposited. Power is applied from a standard 15 kilowatt power supply operating under power control at various percentages of the nominal power. The atmosphere in the sputtering chamber is argon at a pressure of 3 millitorr. The speed of the conveyor and number of passes under the individual cathodes are varied to obtain the desired film thickness. The term film thickness is used loosely with respect to the agglomerated silver film, which is discontinuous, where a term such as quantity of deposited silver might be more accurate. A transmission photometer with a 550 nanometer filter is installed on-line to monitor the transmission of the film between passes under the stationary cathodes.

With the coater operating at typical conditions, a single pass of a glass substrate under the silver cathode results in a continuous silver film which can be varied in transmission. When a transparent copper film is sputtered over this continuous transparent silver film, the appearance of the coated glass from the glass side may range from silver to copper depending on the thicknesses of the silver and copper layers. In all cases, however, the appearance is highly reflective. For example, after one pass at 90 inches (2.3 meters) per minute under the silver cathode at 300 watts of power, which deposits sufficient silver for the first layer in a continuous film, and a second pass under the copper cathode at the same speed but at 1125 watts of power, which produces the desired copper film thickness, the resultant coated glass has a reflectance of 46.15 percent and chromaticity coordinates of $x=0.3681$ and $y=0.3626$ using Illuminant D. Visually, the article is considerably brighter and more yellow than a wet chemically coated article with equivalent amounts of silver and copper layers.

To produce a discontinuous agglomerated silver film in accordance with the present invention, the power applied to the silver cathode in this example is reduced to 150 watts. At the same conveyor speed, two passes are necessary to deposit the same quantity of silver as in the previous example. However, at the lower power, the silver is deposited in a discontinuous agglomerated state. A single pass under the copper cathode is carried out exactly as in the previous example. The coated glass article, which has a two layer silver/copper coating containing the same amounts of silver and copper as in the previous example, has a significantly different appearance. The reflectance is substantially lower at 35.52 percent, the transmission is 24.2 percent, and the chromaticity coordinates of $x=0.3519$ and $y=0.3404$ represent a pinkish color characteristic of the wet chemically deposited silver/copper film.

The above examples are offered to illustrate, not to limit, the present invention. The present invention may be practiced by various means for depositing a discontinuous agglomerated silver film. Other combinations of cathode power, multiple passes, conveyor speed and so on are practicable. In addition, a discontinuous agglomerated silver film of appropriate thickness may be obtained by increasing the gas pressure in the coater as illustrated in FIG. 2. Another method for achieving the desired silver in discontinuous form is by treating the glass surface to lower its surface energy and weaken the glass/silver attractive forces. The scope of the present invention is defined by the following claims.

We claim:

1. A method for producing a low reflectance transparent colored film on a transparent substrate comprising the steps of:
   a. sputtering silver onto a surface of the substrate at a rate sufficient to permit agglomeration of the silver particles to form a discontinuous film;
   b. discontinuing the sputtering of silver before said agglomerated silver particles form a continuous film;
   c. sputtering copper onto the discontinuous agglomerated silver to form a transparent two-layer silver/copper film having a low reflectance colored appearance.

2. A method according to claim 1, wherein silver is sputtered onto a transparent glass substrate to form a discontinuous agglomerated film having a transmission minimum measured on the substrate of about 40 to 55 percent.

3. A method according to claim 2, wherein said discontinuous agglomerated film has a transmission minimum of about 42 to 50 percent.

4. A method according to claim 3, wherein said discontinuous agglomerated film has a transmission minimum of about 44 to 46 percent.

5. A method according to claim 1, wherein the sputtering of a discontinuous silver film is accomplished by applying power to the cathode at a sufficiently low level to allow silver deposited on the substrate surface to agglomerate.

6. A method according to claim 1, wherein the sputtering of a discontinuous silver film is accomplished by sputtering in an inert atmosphere at sufficiently high pressure to cause agglomeration of silver deposited on the substrate surface.

7. A method according to claim 1, wherein the sputtering of a discontinuous silver film is accomplished by sputtering silver onto a surface sufficiently hot to cause agglomeration of the silver deposited onto the substrate surface.

8. A method according to claim 1, wherein the sputtering of a discontinuous silver film is accomplished by sputtering silver onto a surface of sufficiently low energy to allow agglomeration of the silver deposited onto the substrate surface.

* * * * *